United States Patent [19]
Said et al.

[11] Patent Number: 5,339,264
[45] Date of Patent: Aug. 16, 1994

[54] SYMMETRIC TRANSPOSED FIR DIGITAL FILTER

[75] Inventors: Ahmed Said, Beaverton; Michael Seckora, Gales Creek, both of Oreg.

[73] Assignee: Tektronix, Inc., Wilsonville, Oreg.

[21] Appl. No.: 919,798

[22] Filed: Jul. 27, 1992

[51] Int. Cl.$^5$ .............................................. G06F 15/31
[52] U.S. Cl. ............................ 364/724.16; 364/724.10
[58] Field of Search ...................... 364/724.01, 724.10, 364/724.16, 724.12, 724.13, 728

[56] References Cited

U.S. PATENT DOCUMENTS

| | | | |
|---|---|---|---|
| 4,263,593 | 4/1981 | Dagostino et al. | 340/728 |
| 4,344,149 | 8/1982 | van de Meeberg et al. | 364/724.10 |
| 5,081,604 | 1/1992 | Tanaka | 364/724.16 |
| 5,206,821 | 4/1993 | Young et al. | 364/724.10 |

OTHER PUBLICATIONS

1992 IEEE International Symposium on Circuits and Systems, A Floating Point FIR Filter With Reduced Exponent Dynamic Range, Horrocks et al., May 10–13, 1992, 1808–1811.

Multirate Digital Signal Processing, Ronald R. Crochiere et al., Prentice-Hall, Inc., Englewood Cliffs, N. J., (1983), 74, 77.

*Primary Examiner*—Long T. Nguyen
*Attorney, Agent, or Firm*—Boulden G. Griffith

[57] ABSTRACT

A finite impulse response (FIR) digital filter (100, 170, 175, 180) incorporates both symmetric and transposed structures in a configuration that suites ASIC implementation. The filter coefficients can be arranged in ascending order to implement coefficient block floating point, or in descending order. To further facilitate coefficient block floating point, filter coefficients are chosen so that each cell has an exponent value equal to or greater than that of a preceding cell. A right shift is provided between adjacent cells to equate the exponent value of a sum output of a preceding cell with that of the succeeding cell. Variable decimation is provided by downloading appropriate filter coefficient and adjusting a decimation forward clock. Multiple channels can also be accommodated.

16 Claims, 10 Drawing Sheets

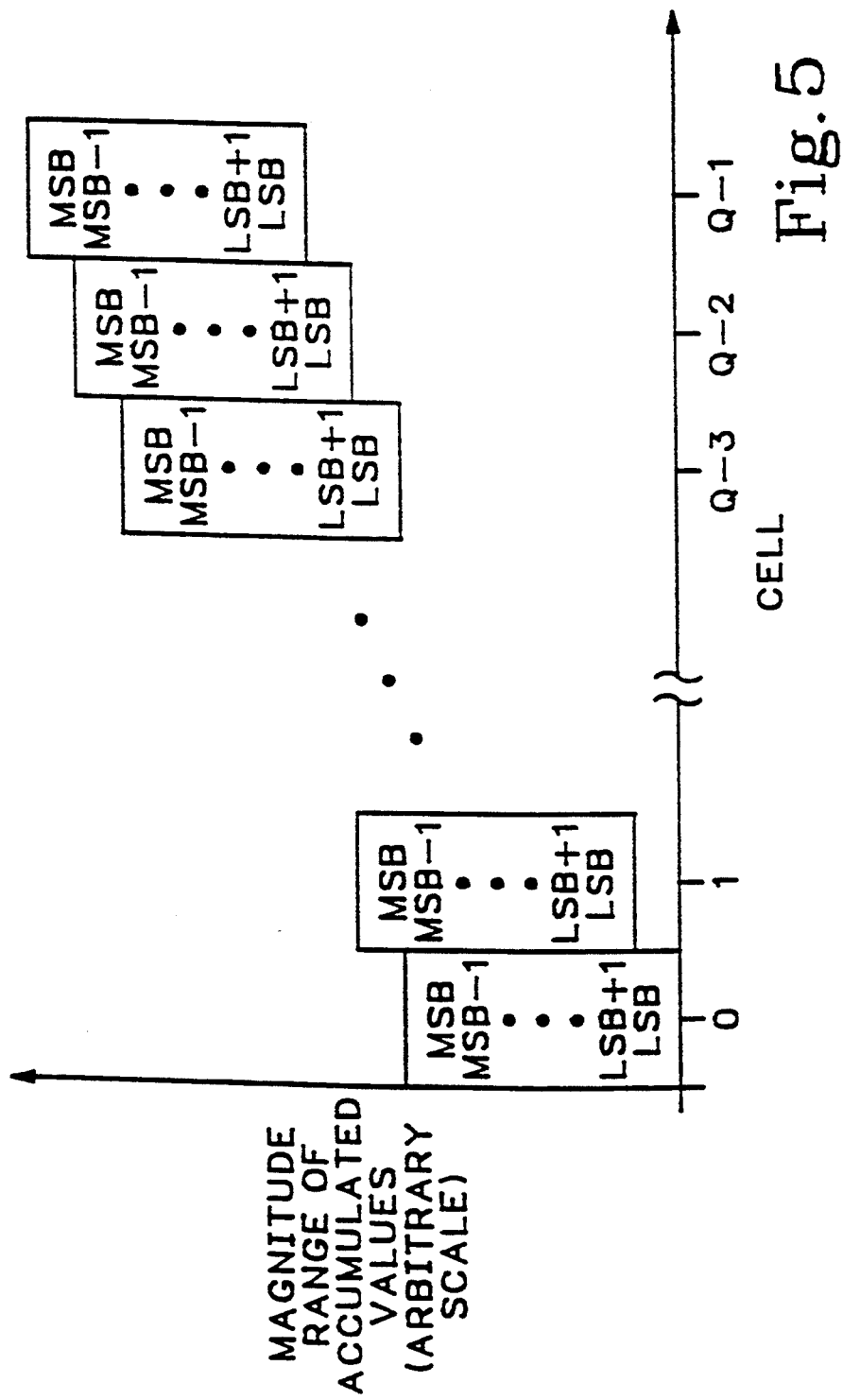

SYMMETRIC TRANSPOSED FIR DIGITAL FILTER

TECHNICAL FIELD

The present invention relates generally to digital filters and, in particular, to finite impulse response (FIR) digital filters.

BACKGROUND OF THE INVENTION

A general FIR filtering operation can be represented by the following equation:

$$y(n) = \sum_{m=0}^{M-1} x(n-m)a(m) \quad (1)$$

in which each term x(n-m) represents an input signal component applied to a digital filter, each term a(m) is a filter coefficient representing the characteristics of the digital filter, and y(n) is the resulting output signal provided by the digital filter. FIG. 1 shows a prior art FIR digital filter 10 in transposed form implementing the general FIR filtering operation of equation (1). Filter 10 includes M-number of identical cells $12_0$, $12_1$, ..., $12_{M-1}$ connected to an input 14. A subscript lower case "m" is used to refer generally to one of cells $12_0$, $12_1$, ..., $12_{M-1}$ or its components.

Each cell $12_m$ includes a multiplier $16_m$ for multiplying an input signal component x(n-m) by a corresponding filter coefficient a(m) stored in a register $18_m$. An adder $20_m$ in each cell $12_m$ adds the product provided by multiplier $16_m$ to a sum of products provided by adder $20_{m-1}$ of cell $12_{m-1}$. A register $22_m$ in each cell $12_m$ provides a delay after adder $20_m$ to synchronize the application of signals to each successive adder $20_{m+1}$. Digital filter 10 is referred to as transposed due to registers $22_m$ being positioned between $20_m$ adders.

The transposed form of digital filter 10 is advantageous because each cell $12_m$ has a regular configuration that allows multiple cells to be connected together or "cascaded" to increase the filter length and modified to accommodate multiple channels. As a result, digital filter 10 is well suited for implementation in an application-specific integrated circuit (ASIC). A disadvantage of digital filter 10, however, is that it employs twice the number multipliers $16_m$, which are relatively large, complex components, as are required by a symmetric filter as shown in FIG. 2.

FIG. 2 shows a prior art FIR digital filter 26 in symmetric form implementing a linear-phase FIR filtering operation. A linear-phase filter has symmetric filter coefficients in which a(m)=a(M-1-m) such as, for example a(0)=a(M-1). To process the M-number of input signal components x(n-m) of equation (1), filter 26 includes (M/2)-number of adders $28_0$, $28_1$, ..., $28_{M/2-1}$ connected to an input 30 to receive symmetric pairs of symmetric input signal components x(0) and x(M-1), x(1) and x(M-2), ..., x(M/2) and x(M/2-1), respectively. Delay registers $32_0$, $32_1$, ..., and $32_{M-1}$ are connected to input 36 and coordinate the application of the input signal components to adders $28_0$, $28_1$, ..., $28_{M/2-1}$. Multipliers $38_0$, $38_1$, ..., $38_{M/2-1}$ receive the sums provided by respective adders $28_0$, $28_1$, ..., $28_{M/2-1}$ and multiply the sums by symmetric filter coefficients a(0), a(1), ..., a(M/2-1) stored in registers $40_0$, $40_1$, ..., $40_{M/2-1}$, respectively. The product formed by each multiplier $38_m$ is delivered to a chain of adders 42 to form the output of digital filter 26.

An advantage of the symmetric configuration of digital filter 26 is that the number of multipliers $38_m$ is reduced approximately by one-half. Digital filter 26 is disadvantageous, however, because it is not well suited for ASIC implementation due to the irregularity of its direct form cell shape, and because it is not suitable for decimation.

FIG. 3 shows a prior art FIR digital filter 48 that incorporates decimation and is sometimes called a "decimator." Digital filter 48 is generally similar to filter 10 of FIG. 1, except that the former includes only M/L-number of identical cells $50_0$, $50_1$, ..., $50_{M/L}$ connected to an input 52 to process M-number of input signal components. Each cell $50_m$ includes a multiplier $54_m$ for multiplying L-number of input signal components by corresponding filter coefficients a(m), a(m+1), ..., a(m+L) stored in a register $56_m$. An adder $58_m$ cooperates with a delay register $60_m$ and a 2-to-1 multiplexer $62_m$ to add or accumulate the products of the input signal components and corresponding filter coefficients provided by multiplier $54_m$. After accumulating L-number of such products, a forward control signal is applied to a forward control input $66_m$ of multiplexer $62_m$ to pass the accumulated value to multiplexer $62_{m-1}$ and adder $58_{m-1}$ of next successive cell $50_{m-1}$. Although decimation permits a reduction in the number of cells, digital filter 48 suffers from the same disadvantages discussed with respect to transposed digital filter 10.

Prior art digital filters 10, 26, and 48 typically use fixed-point processing of the input signal components and filter coefficients, which processing limits accuracy due to truncation or round-off error. More specifically, fixed-point processing represents a number by a fixed number of bits having a fixed exponent value (fixed with respect to a decimal). If a number is too small to be wholly represented within those fixed bits, as is often the case with filter coefficients, then to the extent the number is not utilized, error is induced. Furthermore, it is possible in filters of long length that a coefficient is so small that it is not represented at all in the fixed point register, thus inducing significant error.

SUMMARY OF THE INVENTION

An object of the present invention is, therefore, to provide a symmetric transposed FIR digital filter with improved signal processing accuracy.

Another object of this invention is to provide a symmetric transposed FIR digital filter with variable decimation.

A further object of the present invention to provide the above objects in cells which are suitable for ASIC implementation.

The attainment of these and related objects may be achieved through use of the novel symmetric transposed FIR digital filter herein disclosed. A symmetric transposed FIR digital filter in accordance with the present invention incorporates both symmetric and transposed structures with decimation to realize a digital filter having about one-half the multipliers of the transposed structure in a configuration which suites ASIC implementation. The filter coefficients are preferably arranged in ascending order to permit utilization of coefficient block floating point to improve signal processing accuracy.

In coefficient block floating point processing, each number or value is defined by two binary components, a mantissa and an exponent, with the coefficients in each cell having the same exponent. Next adjacent cells in the digital filter are configured to have exponents that differ by a predetermined value, (e.g., one or two). With a binary shift corresponding to the difference in magnitude of the exponent values of adjacent cells, the mantissa values may be added by conventional fixed-point processing with accuracy approaching that of floating-point processing. As a result, coefficient block floating point processing provides the accuracy characteristic of conventional floating point processing at speeds characteristic of fixed-point processing.

The attainment of the foregoing and related objects, advantages and features of the invention should be more readily apparent to those skilled in the art, after review of the following more detailed description of the invention, taken together with the drawings.

BRIEF DESCRIPTION OF THE DRAWINGS

FIG. 5 is a diagram illustrating exemplary relative magnitudes of cells in the FIR decimator digital filter of FIGS. 4A and 4B.

DETAILED DESCRIPTION OF PREFERRED EMBODIMENTS

Figure 1:
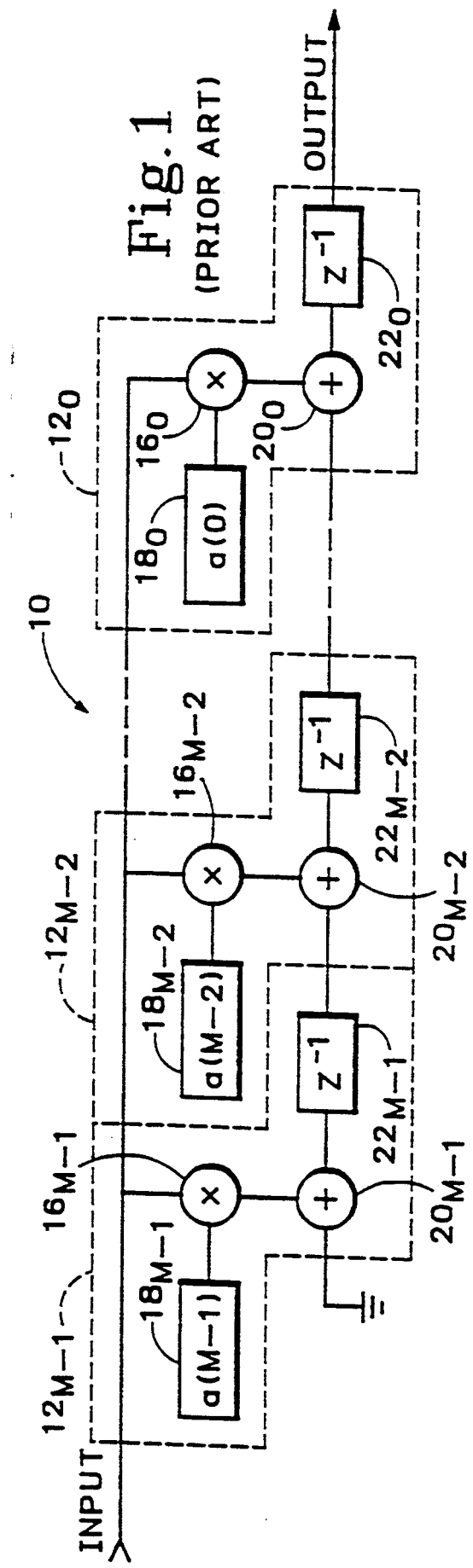
FIG. 1 is a schematic current diagram of a prior art transposed FIR digital filter.
Figure 2:
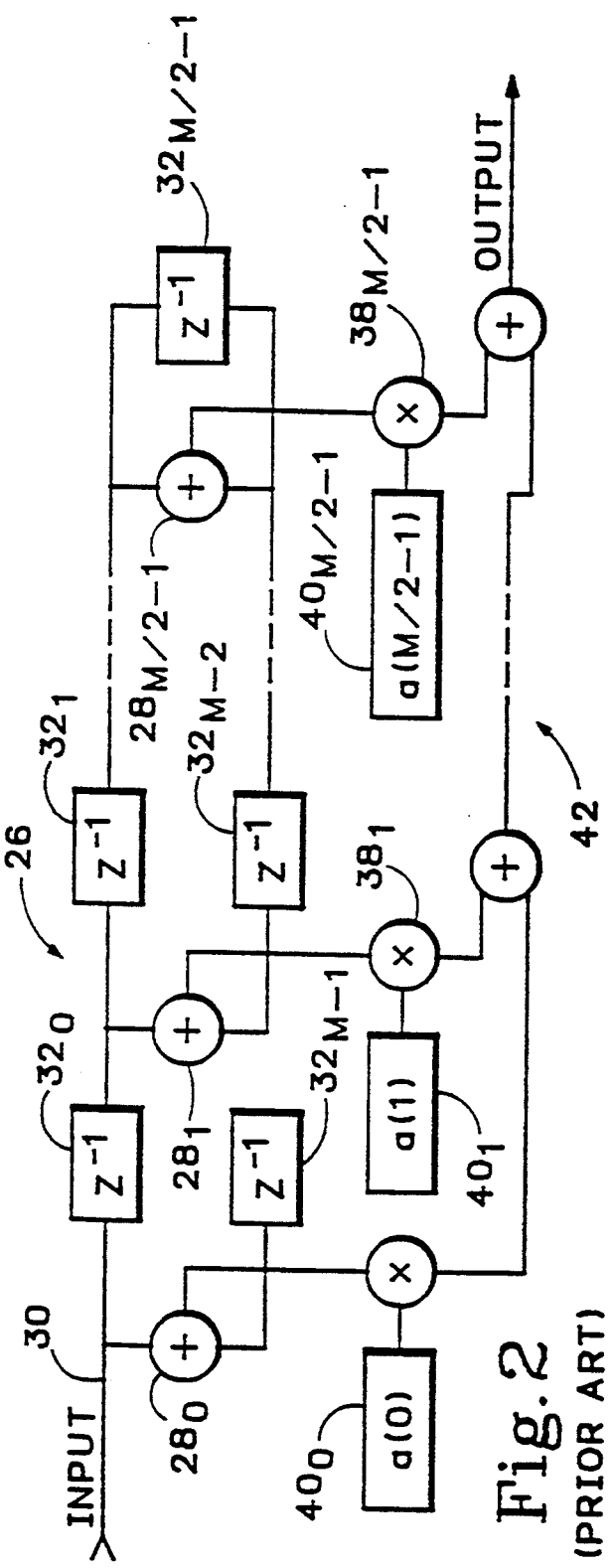
FIG. 2 is a schematic circuit diagram of a prior art symmetric FIR digital filter.
Figure 3:
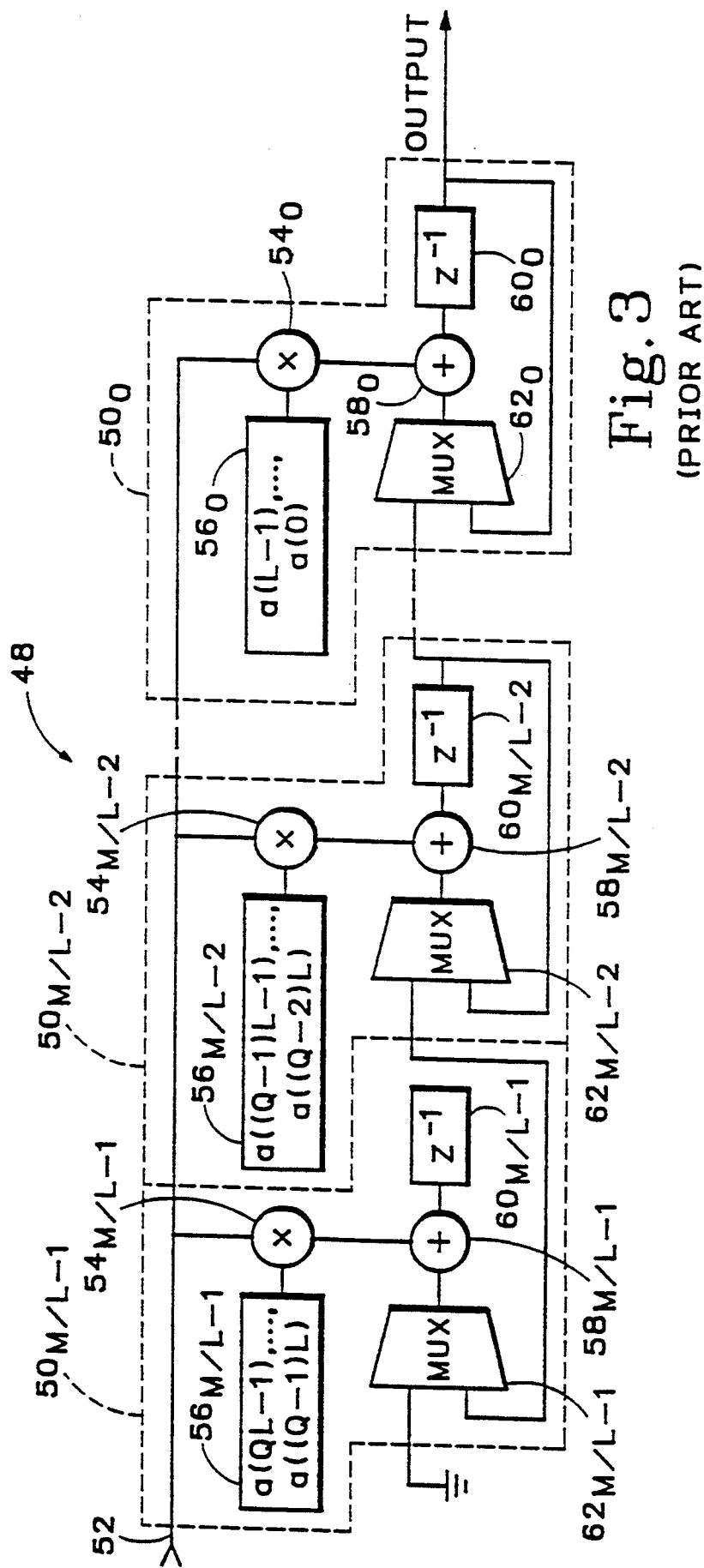
FIG. 3 is a schematic circuit diagram of a prior art transposed FIR decimator.
Figure 4A:
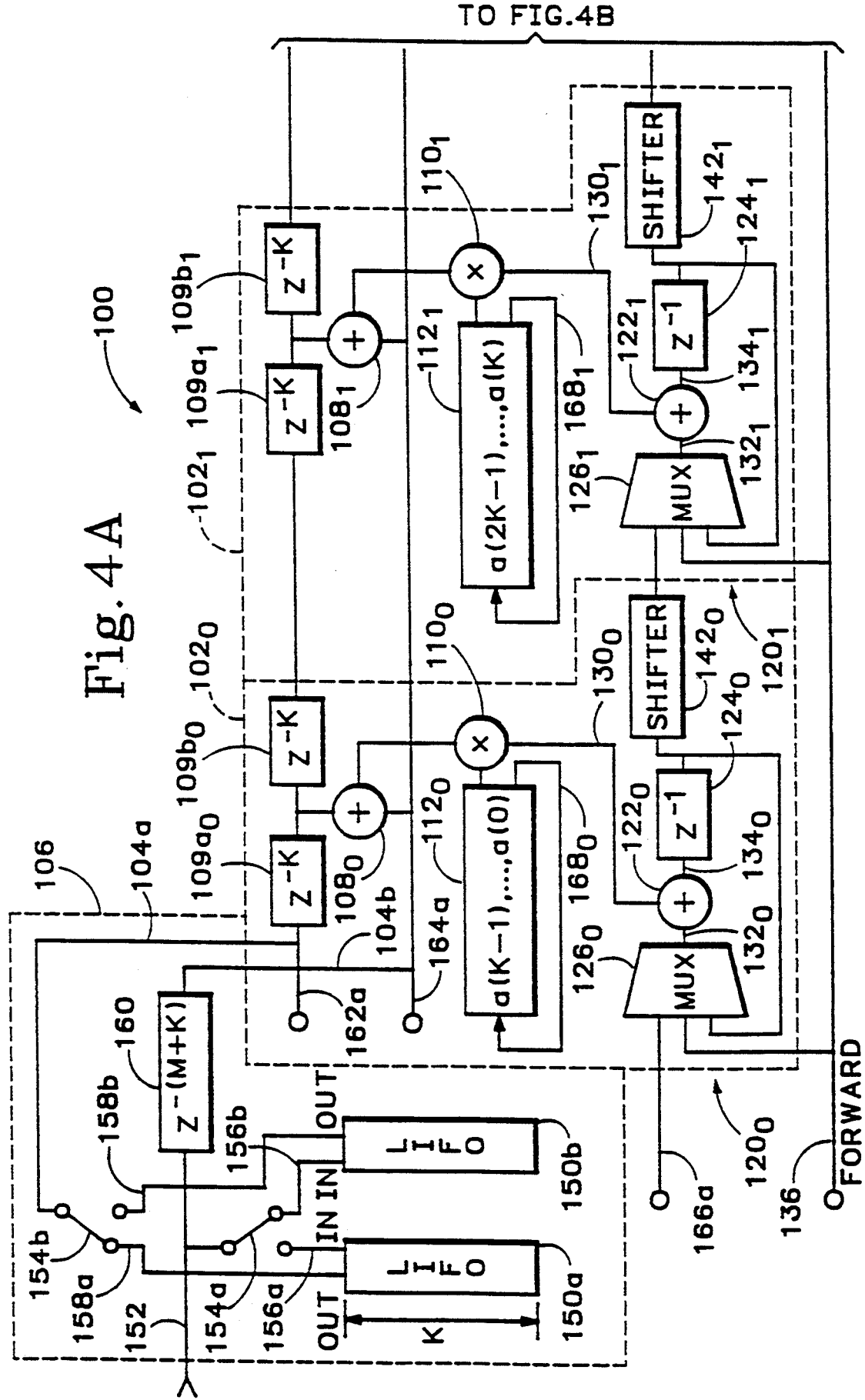
FIGS. 4A and 4B are a schematic circuit diagram of a first preferred embodiment the symmetric transposed FIR digital filter with decimation in accordance with the present invention.
Figure 4B:
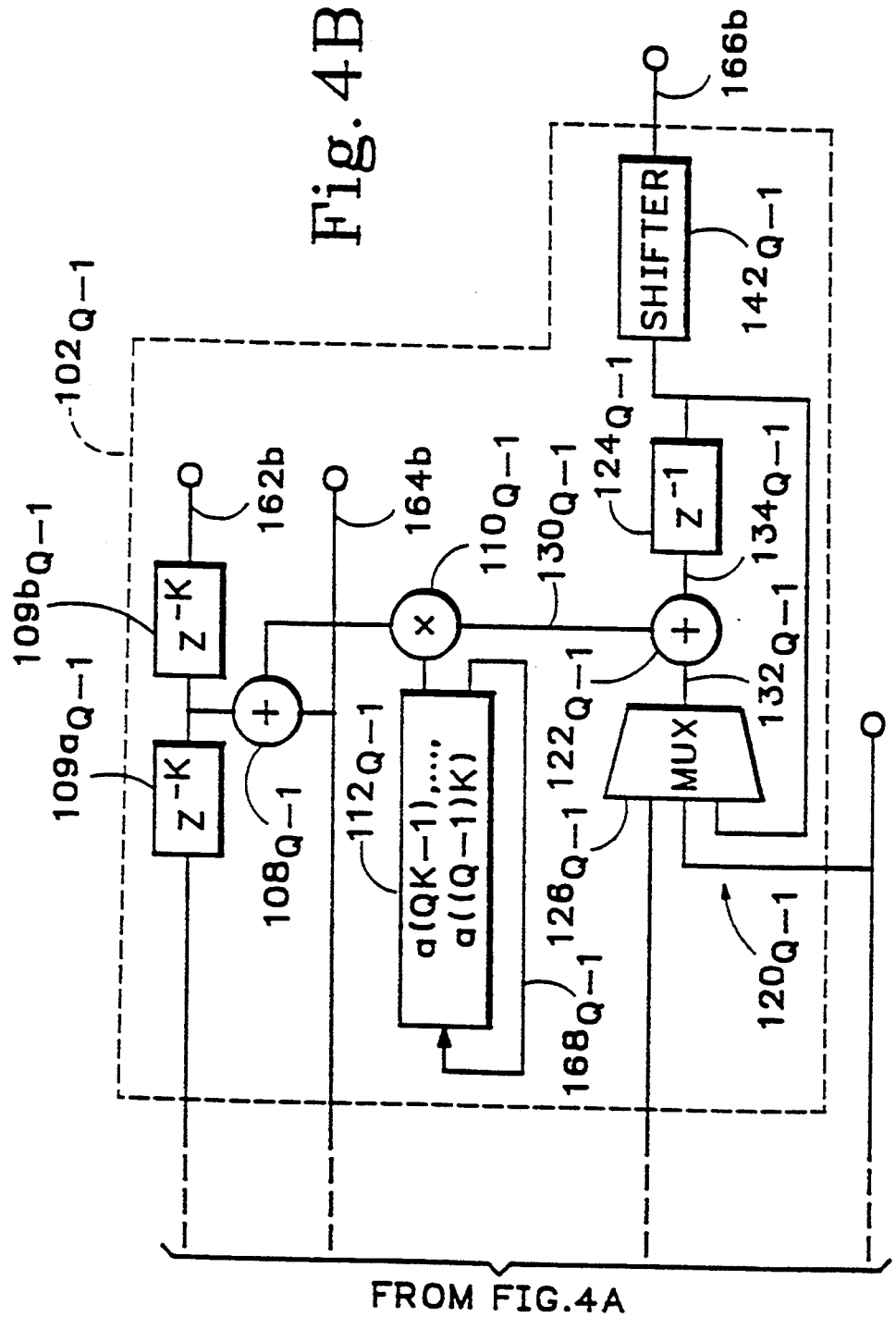

FIGS. 4A and 4B show a general implementation of a symmetric transposed finite impulse response (FIR) digital filter 100 of the present invention. Digital filter 100 includes Q-number of cells $102_0, 102_1, \ldots, 102_{Q-1}$ connected to a pair of signal inputs 104a and 104b provided by a data input circuit 106. Cells $102_0, \ldots, 102_{Q-1}$ are substantially identical and subscript lowercase "q" is used herein to refer generally to any of cells $102_0, 102_1, \ldots, 102_{Q-1}$ or its components.

Each cell $102_q$ includes an adder $108_q$ that receives from signal inputs 104a and 104b pairs of input signal components corresponding to symmetric filter coefficients. Delay registers $109a_q$ and $109b_q$ are positioned along input 104a, respectively, before and after adder $108_q$ to coordinate symmetric operation of digital filter 100. Delay registers $109a_q$ and $109b_q$ each provide a delay of K-number of clock cycles for digital filter 100. For purposes of simplicity, clock signal paths are not shown.

Adder $108_q$ delivers each sum to a multiplier $110_q$, which multiplies the sum by the corresponding filter coefficient stored in a decimation register $112_q$. The products generated by multiplier $110_q$ are delivered to an accumulator subcircuit $120_q$ which includes a fixed-point adder $122_q$ that cooperates with a delay register $124_q$ and a 2-to-1 multiplexer $126_q$ to add or accumulate the products of the symmetric input signal components and corresponding filter coefficients provided by multiplier $110_q$.

More specifically, adder $122_q$ receives a product at an input $130_q$ and a partial sum at an input $132_q$ and delivers a sum of the two to an output $134_q$. Delay register $124_q$ receives the sum and returns it as the partial sum to multiplexer $126_q$ after a delay of one clock cycle. During the one clock cycle delay multiplier $110_q$ generates its next product for delivery to adder $122_q$.

After it accumulates K-number of products, accumulator subcircuit $120_q$ passes the accumulated value to next successive cell $102_{q+1}$ in response to a forward clock signal delivered to multiplexer $126_q$ by a forward clock terminal 136. Each cell $102_q$ includes a binary shifter component $142_q$ that receives the accumulated value transferred from the cell $102_q$ and delivers a right-shifted signal to multiplexer $126_{q+1}$ in accordance with coefficient block floating point processes described below in greater detail.

The filtering function performed by the symmetric transposed configuration of filter 100 may be characterized as follows. The output response y(n) set forth in equation (1), which represents the general operation of an FIR filter, can be rewritten as:

$$\sum_{m=0}^{M/2-1} x(n-m)a(m) + \sum_{m=M/2}^{M-1} x(n-m)a(m), \quad (2)$$

which can be reduced to:

$$\sum_{m=0}^{M/2-1} x(n-m)a(m) + \quad (3)$$

$$\sum_{m=0}^{M/2-1} x[n-(M-1)+m]a[(M-1)-m].$$

For a symmetric digital filter in which a(m)=(M-1-m), equation (3) can be reduced to:

$$\sum_{m=0}^{M/2-1} \{x(n-m) + x[(n-(M-1))+m]\}a(m), \quad (4)$$

which can be rewritten as:

$$\sum_{m=0}^{M/2-1} [x(n-m) + x'(n+m)]a(m) \quad (5)$$

where x' (n)=x[n-(M-1)], i.e., a version of x(n) delayed by the term (M-1).

Similarly, to modify the general equation of the FIR filter to implement decimation, equation (1) can be rewritten as:

$$\sum_{q=0}^{Q-1} \sum_{k=0}^{K-1} x[n-(qK+k)]a(qK+k) \quad (6)$$

where K is the decimation factor, Q is the number of cells 102 and the filter length M=QK. For a symmetric decimator, characterized by the equation M=2QK for an even-numbered filter length, the same approach can be followed to obtain:

$$\sum_{q=0}^{Q-1} \sum_{k=0}^{K-1} \{x[n-(qK+k)] + \quad (7)$$

-continued $$x[(n - (M - k)) + (qK + k)]\}a(qK + k)$$

which can be rewritten as:

$$\sum_{m=0}^{M/2-1} [x_q(n - k) + x_q'(n + k)]a(m) \quad (8)$$

where $x_q(n) = x(n-qK)$, and $x_q' = x_q[n-(M-1)+2qK]$ (i.e., $x_q'$ is a version of $X_q$ delayed by the term (M-1-2qK). The foregoing principles are similarly applicable to a symmetric decimator with an odd-numbered filter length M=2QK-1. The following description is directed primarily to even-numbered filter lengths for purposes of simplicity.

Signal inputs 104a and 104b receive input signal components from data input circuit 106 having includes a pair of last-in, first-out (LIFO) registers 150a and 150b that alternately receive K-number of input signal components from a system input 152. The K-number of input signal components delivered to LIFO registers 150a and 150b are delivered to signal input 104a in a sequence reversed from that in which the input signal components were delivered to LIFO registers 150a and 150b. Input signal components are alternately delivered to and transferred from LIFO registers 150a and 150b by a pair of switches 154a and 154b, the former of which alternately connects LIFO inputs 156a and 156b to system input 152 and the latter of which alternately connects outputs 158b and 158a to signal input 104a. A delay register 160 with a delay period (M+K)-number of clock cycles is connected to system input 152 and delivers delayed input signal components to input 104b.

Table I illustrates the arrangement of input signal components provided by input circuit 106 configured to provide decimation factor K of 5 and a filter length M of 20. It will be appreciated that such a configuration is merely exemplary and that many other decimation factors and filter lengths could be used.

Column A represents the input signal components x(m) applied to system input 152, one input signal component during each clock cycle. Column B shows successive K-numbered (i.e., 5) reverse-sequence groups of input signal components delivered to signal input 104a by LIFO registers 152a and 152b. Column C shows the input signal components delivered to signal input 104b by delay register 160 after a delay of (M+K)-number of clock cycles or input signal components. Column D shows the input signal components delivered to adder $108_0$ on input 104a after passing through delay register $109a_0$, and column E shows the input signal components delivered to adder $108_1$ on input 104a after passing through delay registers $109b_0$ and $109a_1$.

The symmetric input signal components added by adder $108_0$ are identified in columns C and D by a single asterisk (*), and the symmetric input signal components added by adder $108_1$ are identified in columns C and E by a double asterisk (**).

TABLE I

| Column A (System Input 152) | Column B (Signal Input 104a) | Column C (Signal Input 104b) | Column D (Adder $108_0$) | Column E (Adder $108_1$) |
|---|---|---|---|---|
| X(0) | — | — | — | — |
| X(1) | — | — | — | — |
| X(2) | — | — | — | — |
| X(3) | — | — | — | — |
| X(4) | — | — | — | — |
| X(5) | X(4) | — | — | — |
| X(6) | X(3) | — | — | — |
| X(7) | X(2) | — | — | — |
| X(8) | X(1) | — | — | — |
| X(9) | X(0) | — | — | — |
| X(10) | X(9) | — | X(4) | — |
| X(11) | X(8) | — | X(3) | — |
| X(12) | X(7) | — | X(2) | — |
| X(13) | X(6) | — | X(1) | — |
| X(14) | X(5) | — | X(0) | — |
| X(15) | X(14) | — | X(9) | — |
| X(16) | X(13) | — | X(8) | — |
| X(17) | X(12) | — | X(7) | — |
| X(18) | X(11) | — | X(6) | — |
| X(19) | X(10) | — | X(5) | — |
| X(20) | X(19) | — | X(14) | X(4) |
| X(21) | X(18) | — | X(13) | X(3) |
| X(22) | X(17) | — | X(12) | X(2) |
| X(23) | X(16) | — | X(11) | X(1) |
| X(24) | X(15) | — | X(10) | X(0) |
| X(25) | X(24) | X(0)* | X(19)* | X(9) |
| X(26) | X(23) | X(1)* | X(18)* | X(8) |
| X(27) | X(22) | X(2)* | X(17)* | X(7) |
| X(28) | X(21) | X(3)* | X(16)* | X(6) |
| X(29) | X(20) | X(4)* | X(15)* | X(5) |
| X(30) | X(29) | X(5)** | X(24) | X(14)** |
| X(31) | X(28) | X(6)** | X(23) | X(13)** |
| X(32) | X(27) | X(7)** | X(22) | X(12)** |
| X(33) | X(26) | X(8)** | X(21) | X(11)** |
| X(34) | X(25) | X(9)** | X(20) | X(10)** |
| ... | ... | ... | ... | ... |

The filter coefficients a(m) of digital filter 100 approximate, for example, the symmetric impulse response function sin(x)/x that characterizes digital filter 100. The filter coefficients approximating the function sin(x)/x are of lowest magnitude at the ends of the sequence of filter coefficients (e.g., a(0) and a(M-1)) and are of greatest magnitude at the middle of the sequence (e.g., a(M/2-1)). It will be appreciated, however, that the filter coefficients a(m) could represent any symmetric filtering function.

The filter coefficients a(m) stored in decimation registers $112_0, 112_1, \ldots, 112_{Q-1}$ are arranged to have ascending magnitude. More specifically, the filter coefficient stored in decimation register $112_q$ of cell $102_q$ have generally smaller magnitudes than the filter coefficients stored in decimation register $112_{q+1}$ of next adjacent cell $102_{q+1}$. Such an arrangement of filter coefficients allows utilization of coefficient block floating point computation of the digital filter response in accordance with present invention.

Coefficient block floating point processing is desirable because it provides greater accuracy than fixed-point processing and is significantly faster and simpler than conventional floating-point processing. As in conventional floating point processing, each numerical value is represented by two numerical components, a mantissa and an exponent. In operation of digital filter 100, the filter coefficients stored in each decimation register $112_q$ represent values having a common exponent value, which is not expressed. The filter coefficients are selected to be of sufficiently low value that the sum of their products with the corresponding input signal components are also of the same exponent value (i.e., overflow of the mantissa is avoided). Alternatively, accumulator subcircuit $120_q$ may be configured to accommodate a predetermined overflow of the mantissa (e.g., 4 bits of overflow). As a result, the sum of the products of filter coefficients and corresponding input signal components within each cell $102_q$ may be obtained by fixed-point processing, thereby allowing adder $122_q$ to be relatively simple and operate at relatively high speeds.

Since each cell $120_q$ corresponds to a predetermined exponent value, the difference between the exponent values of each adjacent pair of cells $102_q$ and $102_{q+1}$ is also known and is preferably of a value such as, for example, 0, 1, or 2. For nonzero differences in the exponent values of adjacent cells $102_q$ and $102_{q+1}$ (e.g., a difference of 2), binary shifter component $142_q$ shifts the mantissa value provided by accumulator subcircuit $120_q$ by two binary decimals to the right. Accordingly, binary shifter component $142_q$ functions to divide the mantissa value provided by accumulator subcircuit $120_q$ to have the greater exponent value employed by accumulator subcircuit $120_{q+1}$.

FIG. 5 is a schematic representation showing the transposition of mantissa values provided by each binary shifter component $142_q$. FIG. 5 is simplified to show a one-place binary decimal right shift between each adjacent pair of cells $102_q$ and $102_{q+1}$. It will be appreciated, however, that each adjacent pair of cells $102_q$ and $102_{q+1}$ could include a different amount of shift or no shift. The transposition or shifting of mantissas provided by binary shifter component $142_q$ is simple to implement at high speeds employing, for example, a digital shifter or merely transposing the conductors connecting adjacent accumulator subcircuits so that the truncated bits are not delivered to cell $102_{q+1}$.

FIG. 5 also illustrates the accuracy provided by coefficient block floating point processing relative to the accuracy of fixed point processing. In fixed point processing, all filter coefficients with exponent values equal to or lower than that of cell $102_{Q-8}$ would be below the resolution of the processing system, thereby being capable of introducing significant cumulative error. In coefficient block floating point processing, however, only the least significant bits of the accumulated value provided by each cell $102_q$ is truncated, thereby minimizing the introduction or error while maintaining the high speed processing characteristic of fixed point processing.

Digital filter 100 is capable of accommodating multiple channels of input signal components delivered to system input 152 alternately by, for example, a multiplexer (not shown). To accommodate C-number of channels, the delay period of each of delay registers $109a_q$, $109b_q$, $124_q$, and 160 is increased by a factor of C to the values CK, CK, C, and C(M+K) clock cycles. Similarly, LIFO registers 150a and 150b are configured to alternately receive CK-number of input signal components from system input 152.

The increased delay periods maintain the synchronization between the various input signal components, products, and sums for each of the multiple channels. The increased delay periods may be obtained, for example, by employing C-number of each of delay registers $109a_q$, $109b_q$, $124_q$, and 160 with respective delay periods of K, K, 1, and (M+K) clock cycles and C-number of LIFO registers 150a and 150b that receive K-number of input signal components.

As a simplified illustration of multiple channel processing by digital filter 100, two channels are sometimes used to process the corresponding real and imaginary parts of a signal. For such a two-channel implementation, delay registers $109a_q$, $109b_q$, $124_q$, and 160 are configured to have delay periods of 2K, 2K, 2, and 2(M+K) clock cycles, respectively, and LIFO registers 150a and 150b each receive 2K-number of input signal components. Table II illustrates a simplified arrangement of input signal components for such a two-channel configuration employing a decimation factor K of 2 and a filter length M of 8. Except for a different decimation factor K and filter length M, Table II employs the format described with reference to Table I above.

TABLE II

| Column A (System Input 152) | Column B (Signal Input 104a) | Column C (Signal Input 104b) | Column D (Adder $108_0$) | Column E (Adder $108_1$) |
|---|---|---|---|---|
| X(0) | — | — | — | — |
| X(1) | — | — | — | — |
| Y(0) | — | — | — | — |
| Y(1) | — | — | — | — |
| X(2) | X(1) | — | — | — |
| X(3) | X(0) | — | — | — |
| Y(2) | Y(1) | — | — | — |
| Y(3) | Y(0) | — | — | — |
| X(4) | X(3) | — | X(1) | — |
| X(5) | X(2) | — | X(0) | — |
| Y(4) | Y(3) | — | Y(1) | — |
| Y(5) | Y(2) | — | Y(0) | — |
| X(6) | X(5) | — | X(3) | — |
| X(7) | X(4) | — | X(2) | — |
| Y(6) | Y(5) | — | Y(3) | — |
| Y(7) | Y(4) | — | Y(2) | — |
| X(8) | X(7) | — | X(5) | X(1) |
| X(9) | X(6) | — | X(4) | X(0) |
| Y(8) | Y(7) | — | Y(5) | Y(1) |
| Y(9) | Y(6) | — | Y(4) | Y(0) |
| X(10) | X(9) | X(0)* | X(7)* | X(3) |
| X(11) | X(8) | X(1)* | X(6)* | X(2) |
| Y(10) | Y(9) | Y(0)* | Y(7)* | Y(3) |
| Y(11) | Y(8) | Y(1)* | Y(6)* | Y(2) |
| X(12) | X(11) | X(2)** | X(9) | X(5)** |
| X(13) | X(10) | X(3)** | (8) | X(4)** |
| Y(12) | Y(11) | Y(2)** | Y(9) | Y(5)** |
| Y(13) | Y(10) | Y(3)** | Y(8) | Y(4)** |
| X(14) | X(13) | X(4) | X(11) | X(7) |
| X(15) | X(12) | X(5) | X(10) | X(6) |
| Y(14) | Y(13) | Y(4) | Y(11) | Y(7) |
| Y(15) | Y(12) | Y(5) | Y(10) | Y(6) |
| ... | ... | ... | ... | ... |

Digital filter 100 may be employed, for example, in a spectrum analyzer or any other suitable digital instrument. As described above, the clock frequency of digital filter 100 is matched to its sampling frequency and is dependent upon the technology used to implement the filter. When implemented in, for example, a CMOS integrated circuit, a clock frequency of approximately 40 MHz is achievable. In contrast, conventional floating point processing is capable of performing at sampling frequencies of only about a few hundred kilohertz.

The filter length M of digital filter 100 is equal to 2QK, in which Q is the number of cells $102_q$ and K is the decimation factor. A filter length M of greater magnitude provides a sharper frequency transition, which is a very desirable characteristic in many applications. Digital filter 100 is preferably implemented with up to about 12 cells $102_q$ on each application-specific integrated circuit (ASIC), multiple ones of which can be connected in series to provide an increased number of cells with a corresponding increase in accuracy. To allow connection of plural ASICs, terminals 162a and 162b are provided on signal input 104a, terminals 164a and 164b are provided on signal input 104b, and terminals 166a and 166b are provided at accumulator subcircuits $120_0$ and $120_{Q-1}$. It will be appreciated that only a first input circuit 106 would be employed for a multi-ASIC digital filter 100.

The decimation factor K employed by digital filter 100 is preferably selectable from a predetermined range of values. For example, each decimation register $112_q$ could include up to 20 filter coefficients of which 1, 2, 4, 5, 10, or 20 could be used. Variable decimation is desireable because it is inversely related to the filter bandwidth. Selection of the value of the decimation factor K would determine which filter coefficients stored in each decimation register $112_q$ are used. For example, the particular filter coefficients corresponding to each decimation register $112_q$ for a particular decimation factor K could be downloaded to register $112_q$ from a memory circuit (not shown).

Figure 6A:
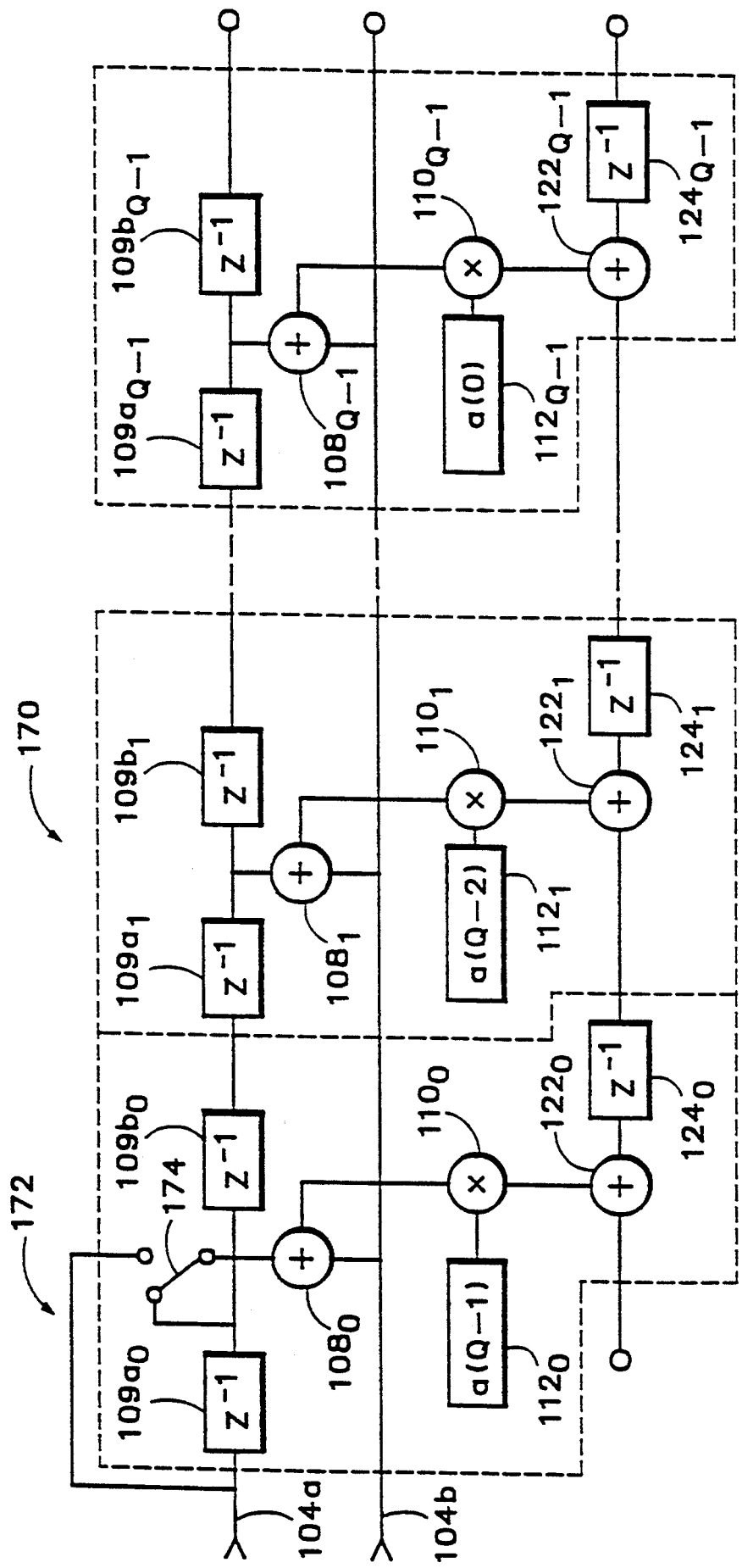
FIGS. 6A and 6B are schematic circuit diagrams of alternative preferred embodiments of the digital filter of the present invention without decimation.

It will be appreciated that the description of digital filter 100 is directed to a general implementation and that various alternative circumstances give rise to particular implementations. For example, FIG. 6A shows an alternative digital filter 170 of the same general configuration of digital filter 100, except that the former that does not employ decimation or coefficient block floating point processing and arranges the filter coefficients to have descending magnitudes. As a result, digital filter 170 is relatively simple to implement while providing a symmetric digital filter with a standard, easily connectable unit cell according to the present invention.

With reference to FIGS. 4A, 4B and 6A, digital filter 170 is simplified in that input circuit 106, multiplexers $126_q$, and binary shifter components $142_q$ of digital filter 100 may be eliminated. More specifically, omitting decimation allows omission of input circuit 106, which generates the reverse-sequence input signal component groups (i.e., the reverse sequence of a single input signal component is itself). Similarly, multiplexers $126_q$ and binary shifter components $142_q$ may be eliminated because the descending magnitudes of the filter coefficients are incompatible with coefficient block floating point processing.

Digital filter 170 preferably includes a bypass 172 of delay register $109a_0$ controlled by a switch 174. Bypass 172 functions to adjust the coordination of input signal components on inputs 104a and 104b according to whether digital filter 170 has a filter length M that is odd or even. Whenever the filter length M is even, switch 174 disconnects bypass 172 and the input signal components pass through delay register $109a_0$. Whenever the filter length M is odd, switch 174 connects bypass 172 and the input signal components bypass delay register $109a_0$.

Figure 6B:
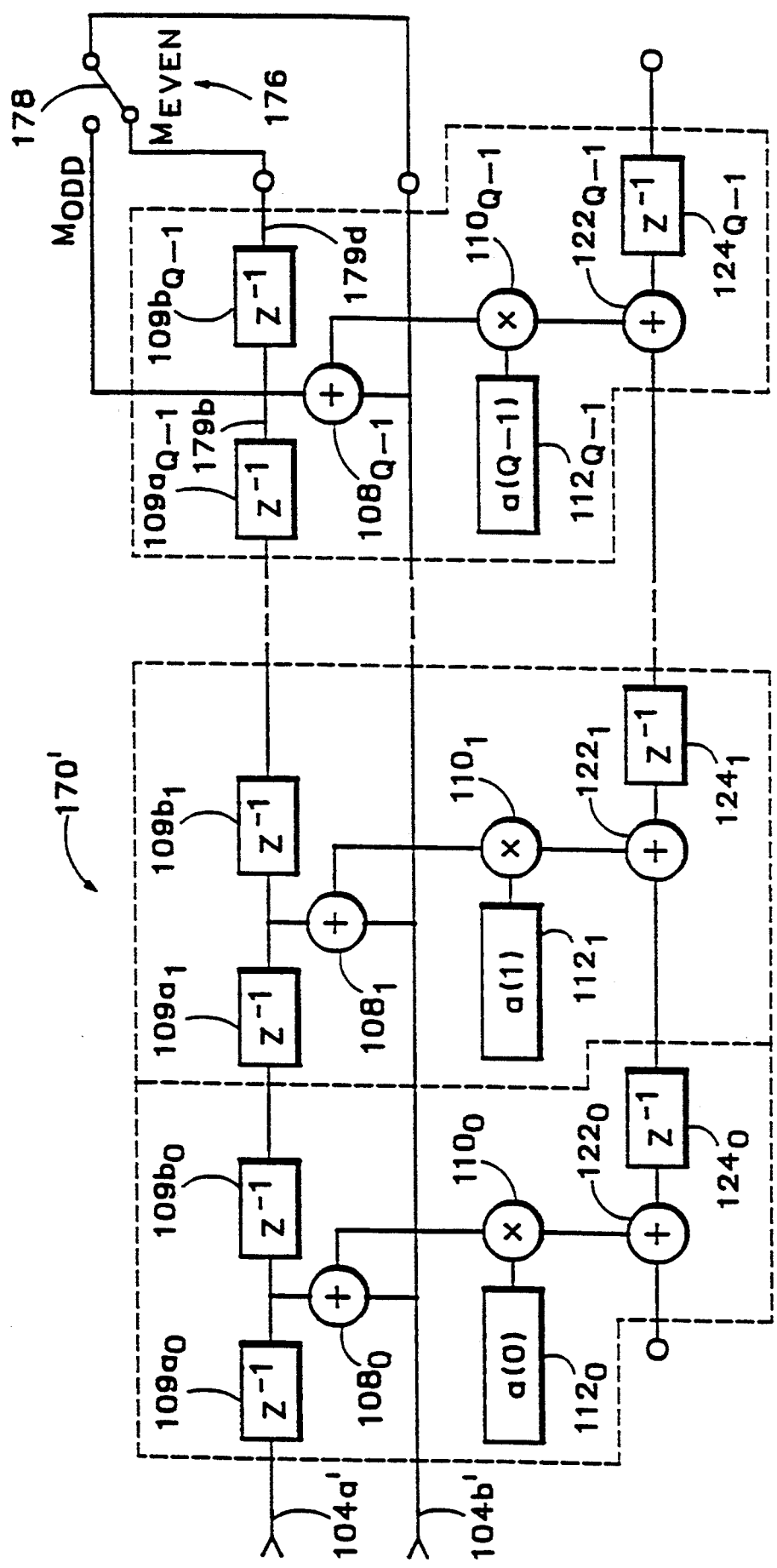

FIG. 6B shows a digital filter 170' generally similar to digital filter 170 but having the filter coefficients arranged with ascending magnitudes. Decimation registers $112_0$, $112_1$, ... $112_{Q-1}$ store the respective filter coefficients a(0), a(1), ... a(Q-1). Further aspects of this implementation are that bypass 172 of digital filter 170 is deleted and all input signal components are applied directly to signal input 104a' and propagate through a switchable coupling 176 to signal input 104b'. Coupling 176 includes a switch 178 that selectively connects signal input 104b' with points 179a and 179b when digital filter 170' has an even- or odd-numbered filter length, respectively.

Figure 7A:
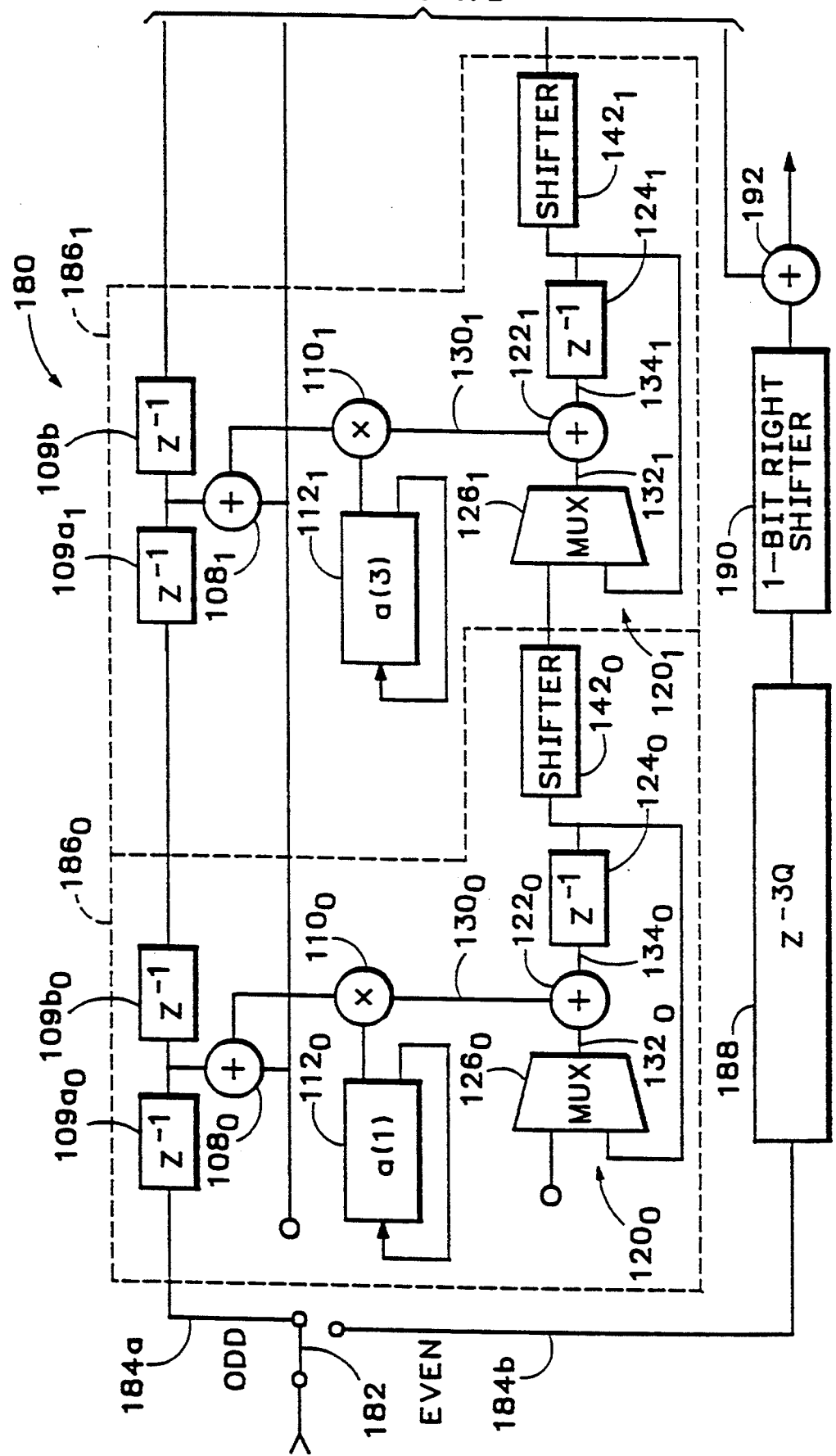
FIGS. 7A and 7B are schematic circuit diagram of an alternative preferred embodiment of the digital filter of the present invention configured to provide half-band decimation.
Figure 7B:
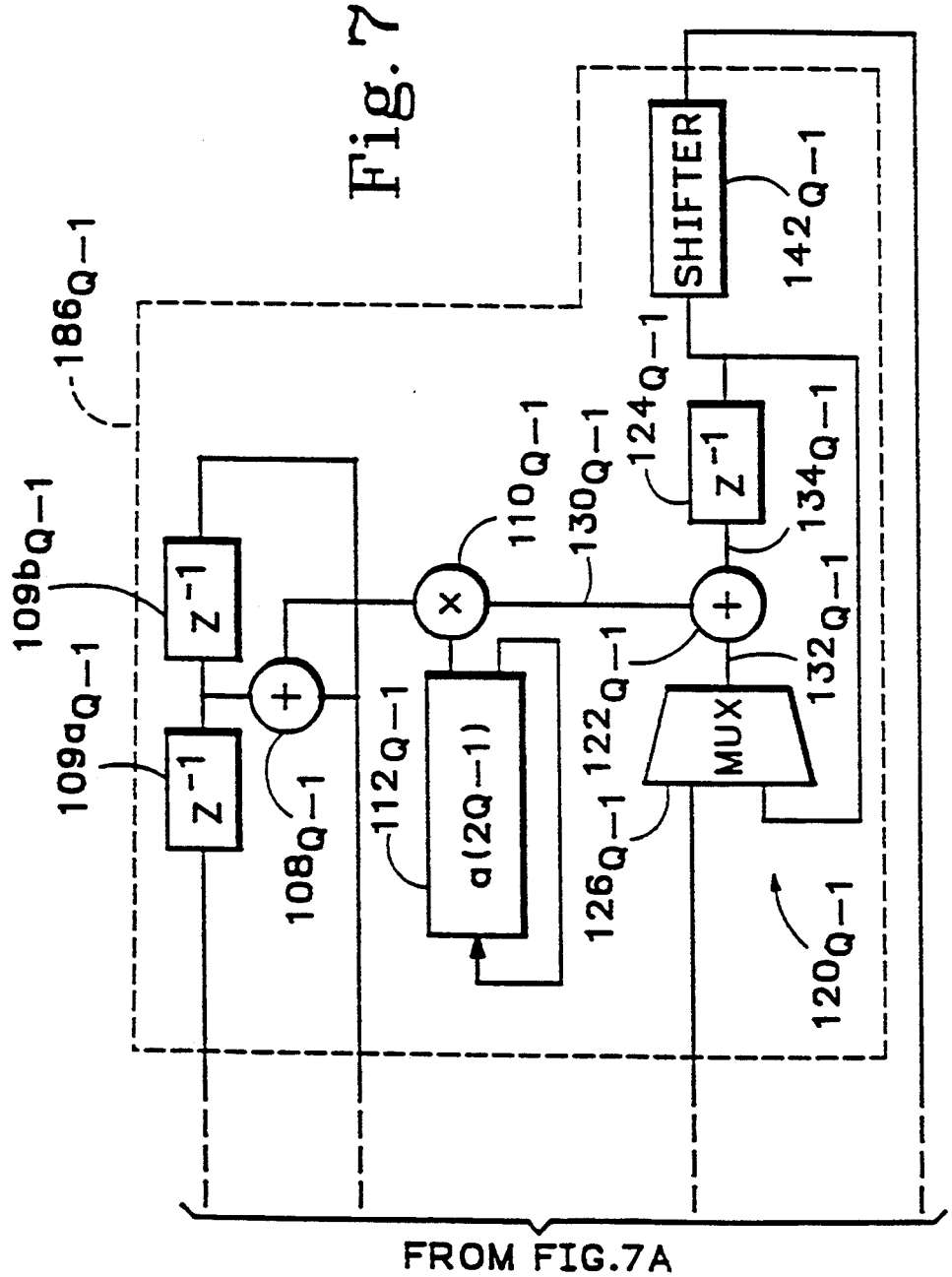

FIGS. 7A and 7B show an alternative digital filter 180 of the same general configuration of digital filter 100 except that the former is specifically directed to a half-band decimator having a decimation factor K=2 and an odd-numbered filter length M=4Q+I. Under such circumstances, all even-numbered filter coefficients are equal to zero, except filter coefficient a(2Q), which equals 0.5. Digital filter 180 may be represented, therefore, by the equation:

$$y(n) = \sum_{m=0}^{2Q} x[n - (2m + 1)]a(2m + 1) + 0.5x(n - 2Q).$$

Digital filter 180 substitutes an input multiplexer 182 for input circuit 106 of digital filter 100. Input multiplexer 182 functions to deliver odd- and even-numbered input signal components to signal inputs 184a and 184b, respectively. Signal input 184a delivers the odd-numbered samples to filter cells $186_q$ having the same general configuration as cells $102_q$ of FIGS. 4A and 4B. Signal input 184b delivers the even-numbered input signal components, of which only the input signal component x(2Q) has a non-zero value, to a delay register 188 having a delay period of 3Q clock cycles. A one-bit shift-right shifter 190 functions to multiply the input signal component x(2Q) by a factor of 0.5, and an adder 192 adds the term 0.5x(2Q) to the resulting sum of products of odd-numbered filter coefficients and input signal components. Digital filter 180 is advantageous because it has an increased bandwidth capability that results from processing only one-half of the input signal components.

Figure 8:
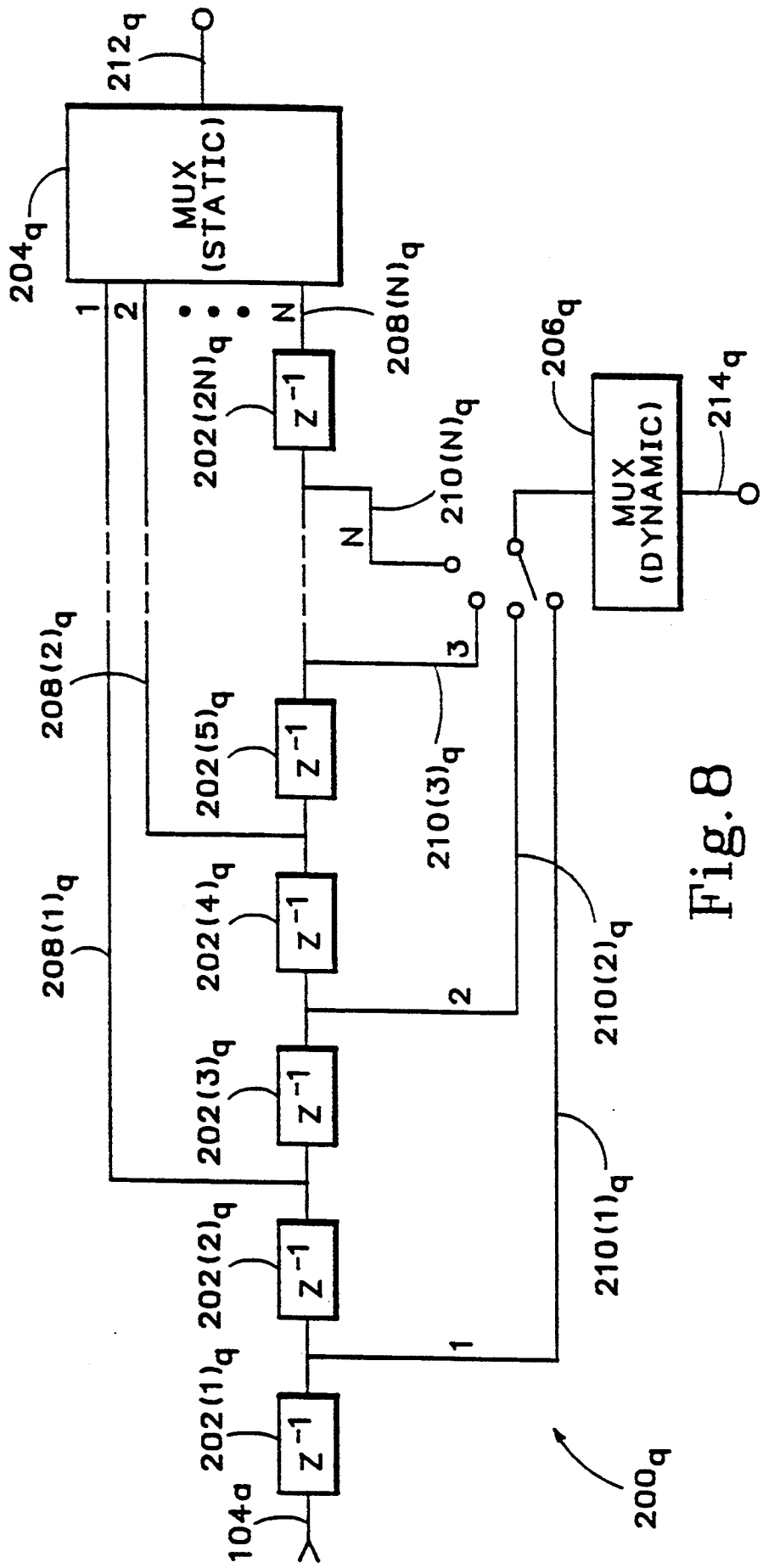
FIG. 8 is a schematic circuit diagram of an alternative delay circuit component suitable for a digital filter of the present invention.

FIG. 8 shows an alternative dynamic delay register configuration 200q that may be substituted for each pair of delay registers $109a_q$ and $109b_q$ in each cell $102_q$ of digital filter 100, thereby allowing elimination of data input circuit 106. Dynamic delay register 200q includes 2N-number of one clock cycle delay registers $202(1)_q$, $202(2)_q$, ..., $202(N)_q$, in which N is greater than or equal to the maximum selectable decimation factor $K_{max}$. Successive pairs of delay registers $202(i)_q$ are connected to a static multiplexer $204_q$ and a dynamic multiplexer $206_q$ by respective inputs $208(1)_q$, $208(2)_q$, ..., $208(N)_q$ and $210(1)_q$, $210(2)_q$, ..., $210(N)_q$. Multiplexers $204_q$ and $206_q$ include terminals $212_q$ and $214_q$ that are connectable to dynamic delay register $200_{q+1}$ and adder $108_q$, respectively.

In operation according to a decimation factor K, multiplexer $204_q$ couples to terminal $212_q$ a K-numbered input $208(K)_q$ extending from between delay registers $202(2K)_q$ and $202(2K+1)_q$. Multiplexer $206_q$ successively connects to terminal $208b_q$ inputs $210(1)_q$, $210(2)_q$, ..., $210(K)_q$ during successive clock cycles. As a result, multiplexer $204_q$ delivers to a next adjacent dynamic delay register input signal components with a delay of 2K-number of clock cycles, and multiplexer $206_q$ delivers to adder $108_q$ input signal components that are symmetric with input signal components present on signal input 104b.

It should further be apparent to those skilled in the art that various changes in form and details of the invention as shown and described may be made without departing from the underlying principles thereof. The scope of the present invention should be determined, therefore, only with reference to the following claims.

We claim:

1. A symmetric transposed finite impulse response digital filter, comprising:

a data input circuit receiving plural input signal components and prearranging them in accordance with a predetermined symmetric format; and plural sequentially-arranged filter cells in data communication with the data input circuit, each filter cell except a first and last filter cell being connectable between a pair of adjacent filter cells, and each filter cell having processing elements for processing selected symmetric input signal components in accordance with corresponding filter coefficients to form a sum of products thereof, and having a product terminal connected to at least one adjacent filter cell to transfer to the adjacent filter cell a sum of products.

2. The digital filter of claim 1 in which each filter cell further includes a binary shifter component connected to the product terminal for selectively shifting the sum of products to be compatibly summed with the products formed by the adjacent filter cell.

3. The digital filter of claim 1 in which each filter cell includes an adder in data communication with the data input circuit for adding the symmetric input signal components and delivering a sum to a multiplier that delivers a product of the sum and a filter coefficient to a coefficient block floating point accumulator subcircuit that adds the products generated by the multiplier.

4. The digital filter of claim 1 in which the data input circuit prearranges the input signal components according to a selected decimation factor and each filter cell includes a decimation register for storing plural filter coefficients corresponding to the selected decimation factor, the processing elements forming the sum of products in accordance with the selected decimation factor.

5. The digital filter of claim 1 in which the data input circuit delivers the prearranged input signal components to the plural sequentially-arranged filter cells on first and second input terminals, the first input terminal carrying the input signal components in sequence and the second input terminal carrying the input signal components in reverse-sequence groups.

6. The digital filter of claim 5 in which the data input circuit includes a pair of last-in, first-out registers alternately coupled to the second input terminal and cooperating to form the reverse-sequence groups of input signal components.

7. The digital filter of claim 1 in which the data input circuit and plural filter cells are formed on an integrated circuit.

8. A symmetric transposed finite impulse response decimator, comprising:

a data input circuit receiving plural input signal components and prearranging them in a symmetric format according to a selected decimation factor; and plural sequentially-arranged filter cells in data communication with the data input circuit, each filter cell except a first and last filter cell being connectable between a pair of adjacent filter cells and including an adder in data communication with the data input circuit for adding the symmetric input signal components and delivering a sum to a multiplier in communication with a decimation register that stores plural filter coefficients corresponding to the selected decimation factor, the multiplier delivering a product of each sum and corresponding filter coefficient to a coefficient block floating point accumulator subcircuit that adds the products generated by the multiplier and includes a product terminal connected to at least one adjacent filter cell to transfer to the adjacent filter cell a sum of products.

9. The digital filter of claim 8 in which each filter cell further includes a binary shifter component connected to the product terminal for selectively shifting the sum of products to be compatibly summed with the products formed by the adjacent filter cell.

10. The digital filter of claim 8 in which the data input circuit delivers the prearranged input signal components to the plural sequentially-arranged filter cells on first and second input terminals, the first input terminal carrying the input signal components in sequence and the second input terminal carrying the input signal components in reverse-sequence groups.

11. The digital filter of claim 10 in which the data input circuit includes a pair of last-in, first-out registers alternately coupled to the second input terminal and cooperating to form the reverse-sequence groups of input signal components.

12. The digital filter of claim 8 in which the data input circuit and plural filter cells are formed on an integrated circuit.

13. A symmetric transposed finite impulse response decimator, comprising:

data input delay circuitry receiving plural input signal components and delaying selected ones thereof to arrange the input signal components to a selected symmetric format; and plural sequentially-arranged filter cells in data communication with the data input delay circuitry, each filter cell having processing elements for processing selected symmetric input signal components in accordance with corresponding filter coefficients to form a sum of products thereof, and each filter cell except a last one having a product terminal connected to at least one adjacent filter cell to transfer to the adjacent filter cell a sum of products, and each filter cell further having a product input terminal for receiving a received sum of products from an adjacent filter cell, and further including a binary shifter component connected to the product terminal for selectively right-shifting the sum of products to be compatibly summed with the products formed by the adjacent filter cell.

14. The digital filter of claim 13 in which each filter cell includes an adder in data communication with the data input delay circuitry for adding the selected symmetric input signal components and delivering a sum to a multiplier that delivers a product of the sum and a filter coefficient to an accumulator subcircuit that adds the products generated by the multiplier.

15. The digital filter of claim 13 in which the data input delay circuitry arranges the input signal components according to a selected decimation factor and each filter cell includes a decimation register for storing plural filter coefficients corresponding to the selected decimation factor, the processing elements forming the sum of products in accordance with the selected decimation factor.

16. The digital filter of claim 13 in which the data input delay circuitry and plural filter cells are formed on an integrated circuit.

* * * * *